United States Patent
Yamaguchi et al.

[11] Patent Number: 5,252,549
[45] Date of Patent: Oct. 12, 1993

[54] SUPERCONDUCTIVE CERAMIC WIRE AND METHOD FOR MAKING SAME

[75] Inventors: Tetsuro Yamaguchi, Urawa; Takuo Takeshita, Omiya; Sadaaki Hagino, Urawa, all of Japan

[73] Assignee: Mitsubishi Kinzoku Kabushiki Kaisha, Tokyo, Japan

[21] Appl. No.: 733,709

[22] Filed: Jul. 22, 1991

Related U.S. Application Data

[60] Division of Ser. No. 559,379, Jul. 25, 1990, Pat. No. 5,110,789, which is a continuation of Ser. No. 237,580, Aug. 29, 1988, abandoned.

[30] Foreign Application Priority Data

Aug. 27, 1987 [JP] Japan .................. 62-213775

[51] Int. Cl.$^5$ .................................. H01L 39/24
[52] U.S. Cl. .................................. 505/1; 29/599; 505/705; 505/917
[58] Field of Search .................. 29/599; 505/1, 800, 505/704, 705, 884, 887, 917, 918; 174/125.1

[56] References Cited

U.S. PATENT DOCUMENTS 5,102,864  4/1992  Rapp et al. ................ 505/1
5,106,825  4/1992  Mandigo et al. .......... 505/1

FOREIGN PATENT DOCUMENTS 0281444  9/1988  European Pat. Off. .

OTHER PUBLICATIONS

Japanese Journal of Applied Physics: Composition Dependence of Superconductivity in $(Ba_{0.1}La_{1.9})$ $Ag$-$Cu_{1-x}O_{4-y}$ System.

Primary Examiner—Joseph M. Gorski
Attorney, Agent, or Firm—Cushman, Darby & Cushman

[57] ABSTRACT

The present invention is related to a superconductive ceramic wire and a method for making same. According to the first aspect of the invention, there is provided a method for making a superconductive ceramic wire, the method comprising the steps of: (a) preparing a superconductive porous ceramics; (b) depositing lead in the pores of the ceramics; (c) covering the lead-deposited ceramics with a metal; and (d) extending the metal-clad and lead-deposited ceramics. According to the second aspect of the invention, there is provided a superconductive ceramic wire which is obtained by: (a) preparing a superconductive porous ceramics; (b) depositing lead in the pores of the ceramics; (c) covering the lead-depositted ceramics with a metal; and (d) extending the metal-clad lead-depositted ceramics.

9 Claims, 1 Drawing Sheet

SUPERCONDUCTIVE CERAMIC WIRE AND METHOD FOR MAKING SAME

This is a division of application Ser. No. 07/559379, filed Jul. 25, 1990, and now U.S. Pat. No. 5,110,789, which is a continuation of application Ser. No. 07/237,580 filed Aug. 29, 1988, abandoned.

BACKGROUND OF THE INVENTION

The present invention is related to a superconductive ceramic wire and a method for making same.

It has been known that composite oxides, referred to as superconductive ceramics hereinafter, composed mainly of yttrium-including a rare earth element (denoted hereinafter by R), an alkaline earth metal, copper and oxygen show a superconductivity at a temperature of 77° K. which is higher than the boiling point of nitrogen.

A conventional method for making the above-mentioned superconductive ceramics is as follows.

First, powdery raw materials, that is, an R oxide ($R_2O_3$), a carbonate of an alkaline earth metal and copper oxide (CuO), average particle diameter being not larger than 10 μm, are mixed at a molecular proportion of 0.5:2:3, respectively.

Second, the mixed raw materials are heat-treated at a temperature between 850° C. and 950° C. for at least 24 hours in an oxygenous atmosphere to form a superconductive ceramic powder.

In order to obtain a superconductive ceramic wire, the superconductive ceramic powder is sintered to make a sintered block therefrom. The block is then charged in a silver or copper pipe, and a diameter thereof is reduced to be on the order of 5 mm by cold swaging, rolling or dieing. Another conventional method for diametrical reduction is to hot extrude the sintered ceramic block.

A problem of the above-mentioned conventional processing for obtaining a superconductive ceramic wire is that fissures and hollows are apt to be created in the superconductive material during the diametrical reduction because of the poor extensibility of ceramics. As the fissures and hollows spoil superconductivity, namely the critical temperature and the critical electric current density Jc, of the material, the diametrical reduction rate has to be kept lower than a certain level. A disadvantage of the superconductive ceramic wire obtained by a conventional method is that the diameter of the wire is not enough small and the material often has fissures and hollows which spoil the superconductivity. Therefore, electric resistance and critical electric current density which might be obtained in a massive superconductive ceramics is not obtained in the superconductive ceramic wires of the conventional process.

SUMMARY OF THE INVENTION

An object of the method for making superconductive ceramic wire according to the first aspect of the present invention is, therefore, to provide a method for making a superconductive ceramic wire which allows a high diametrical reduction of the wire. Another object of the present invention is to provide a method by which creation of fissures and hollows in the wire is restrained. A further object of the invention is to provide a method for making a superconductive ceramic wire having superconductivity and high Jc. By virtue of the extensibility of lead deposited in the pores of the superconductive material, fissures and hollows are prevented from occurring. Even if they occur, they are filled with the lead.

A second aspect of the present invention provides a superconductive ceramic wire having a small diameter. Another object of the second aspect is to provide a superconductive ceramic wire having relatively few fissures and hollows therein. A further object thereof is to provide a superconductive ceramic wire having superconductivity at a boiling point of nitrogen and a high Jc.

According to the first aspect of the present invention, there is provided a method for making a superconductive ceramic wire, the method comprising the steps of: (a) preparing a superconductive porous ceramic; (b) depositing lead in the pores of the ceramic; (c) covering the lead-deposited ceramic with a metal; and (d) extending the metal-clad and lead-deposited ceramic.

According to the second aspect of the present invention, there is provided a superconductive ceramic wire which is obtained by: (a) preparing a superconductive porous ceramics; (b) depositing lead in the pores of the ceramics; (c) covering the lead-deposited ceramics with a metal; and (d) extending the metal-clad and lead-deposited ceramics.

BRIEF DESCRIPTION ON THE DRAWINGS

DETAILED DESCRIPTION OF THE PREFERRED EMBODIMENTS OF THE INVENTION

Figure 1:
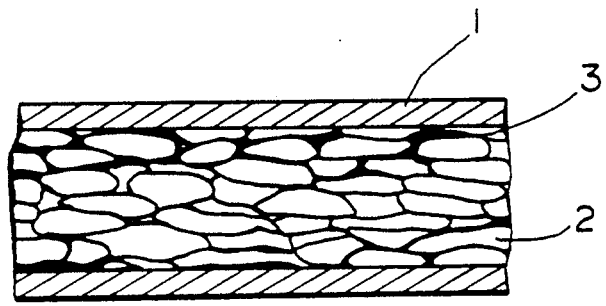
FIG. 1 shows schematically a cross-section of a superconductive wire obtained according to the present invention.

A preferred embodiment of the present invention will now be explained.

According to an embodiment of a method for making a superconductive ceramic wire, lead is laid in the pores of a superconductive porous ceramic essentially composed of an yttrium-including rare earth element, an alkaline earth metal, copper and oxygen. The lead depositted superconductive ceramic is covered by a metal sheath. Then, the metal-clad and lead deposited superconductive ceramics is extended. The lead deposited in the bores acts as a lubricator while the material is extended with the metal sheath. When fissures and hollows are formed in the superconductive material during the extension, the lead fills the defects to moderate their negative effects on the superconductivity. Thus a superconductive wire with little fissures and hollows is made. Lead has been used to fill the pores because lead is soft has, substantial extensibility and deformability, and consequently considerable workability and superconductivity, though it appears at as low a temperature as 9° K.

Preferably, the total amount of lead filling the hollow spaces in the ceramics is between 5% and 40% by volume of the porous superconductive ceramics. If the proportion is smaller than 5%, critical temperature becomes lower than 77° K. because of substantial fissures and hollows existing between ceramic particles. If the proportion is higher than 40%, the critical temperature and the critical current density decrease because ceramic particles are out of contact with each other because of lead layers coming therebetween.

Pores in the ceramic material are not easily filled with lead because the two materials are not affinitive to each other. By chemical-plating a copper or tin layer on the porous superconductive ceramic, lead can be deposited thereon effectively. The chemical-plating also increases the bonding strength between the ceramic and metal sheath, consequently largely improving the extension rate and workability of the material.

As explained above, a method for making superconductive ceramic wire according to the first aspect of the present invention enables a high diametrical reduction in extending the wire. The method restrains the creation of fissures and hollows in the wire during the extension process. It becomes possible to perform a extension at a extension rate higher than 80% while maintaining a superconductivity of the base material. Further, the method enables the making a superconductive ceramic wire having superconductivity at a high temperature and also having a high Jc. Superconductive ceramic wire according to the second aspect of the present invention has a small diameter and has few fissure and hollows therein. Further, the superconductive wire has superconductivity at a high temperature and a high Jc.

Further, the copper sheath for retaining superconductive ceramics therein may be replaced by a silver sheath and the copper plating formed on the porous ceramics may be replaced by a tin plating.

EXAMPLES

A superconductive ceramic wire is made according to the first aspect of the present invention and characteristics of the wire is examined, as follows.

Following raw materials, from (1) to (3), are prepared.

(1) Yttrium oxide ($Y_2O_3$) in a powdery state having an average particle diameter of around 6 μm.

(2) Barium carbonate ($BaCO_3$) in a powdery state having an average particle diameter of around 6 μm.

(3) Copper oxide (CuO) in a powdery state having an average particle diameter of around 6 μm.

Above raw materials are mixed at a following molecular ratio.

$Y_2O_3:BaCO_3:CuO = 0.5:2:3$

Then, the mixture of the raw materials is heat treated at a temperature of 900° C., for 24 hours and in an atmosphere to obtain a superconductive ceramic material having a composition of $YBa_2Cu_3O_7$ and a perovskite structure.

Next, thus obtained superconductive ceramic material is pulverized to a superconductive powder having an average particle diameter of 5 μm.

The superconductive ceramic powder is mixed with a binder, paraffin or stearic acid for example, and formed in a cylindrical shape of 20 mm in diameter and 100 mm in length.

The formed ceramic powder is heat-treated at a temperature of 930° C. for 24 hours at an oxygenous atmosphere and a porous superconductive ceramic pellet is obtained.

Copper is chemical-plated on the porous ceramic pellet in order to improve the affinity of the pellet to lead. More specifically, the ceramic pellet is surface treated by palladium to form a catalyst layer of palladium thereon. Then copper ions are deposited to form a layer of copper thereon. The thickness of the copper layer is about 1 μm. Moisture is removed from the surface thereof. A tin layer may be formed by substituting the copper with tin.

The copper clad ceramic pellet is soaked in pressurized molten lead and the molten lead is deposited in the pores formed in the pellet. The amount of lead deposited in the pellet is varied as shown in Table 1.

The thusly obtained ceramic pellet having a lead deposition formed therein is sheathed in a copper tube of 23 mm in outer diameter, 20 mm in inner diameter and 200 mm in length.

Finally, the pellet and the copper tube are rotary swaged and died so as to reduce its diameter to 1 mm. Thus, a superconductive ceramic wire is obtained. The diametrical reduction rate of the extension processing is 95.6%.

Figure 2:
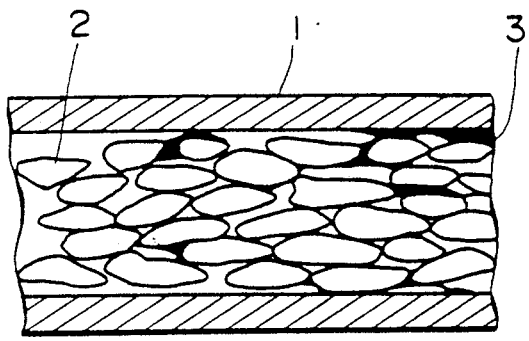
FIG. 2 shows schematically a cross-section of a superconductive wire wherein the amount of lead depositted is insufficient.
Figure 3:
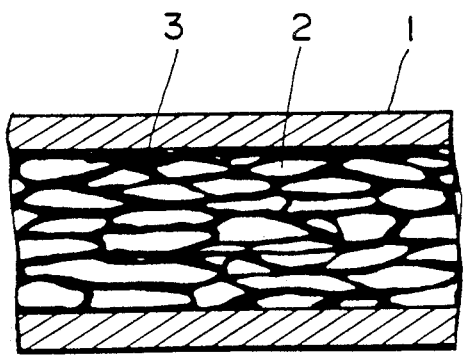
FIG. 3 shows schematically a cross-section of a superconductive wire wherein an excessive amount of lead is depositted.

Table 1 shows the critical temperature Tc(° K.) and critical electric current density at 77° K. ($A/cm^2$) of the ceramic wire. FIGS. 1, 2 and 3 show schematically a cross section of the ceramic wires Example No. 4, 2 and 6, respectively. Superconductive ceramic particles 2 are in contact with each other but also have openings therebetween. Lead 3 is depositted in some of the openings. The ceramic particles 2 and the lead 3 are sheated in a copper tube 1.

As to the example No. 4 shown in FIG. 1 wherein the amount of depositted lead is 15% of the ceramic material, most of the outer openings are filled with the lead but the inner openings remain vacant. Table 1 shows that the Example No. 4 has both a high critical temperature (91° K.) and a high critical electric current density (4,700 $A/cm^2$). The characteristics are obtained when only the outer openings are filled with lead and the inner openings are left vacant as in this example.

As to the Example No. 2 shown in FIG. 2 wherein the amount of lead is 3% of the ceramic material by volume, some of the outer openings are filled with the lead but there remain vacant openings also at an outer side. Inner openings are vacant. In this example, the amount of lead is not enough and fissures and hollows create obstacles to current flow.

As to the Example No. 6 shown in FIG. 3 wherein the amount of lead is 50% by volume, virtually all the openings are filled with lead. Further in this example, lead layers separate ceramic particles thus increasing resistance therebetween.

The comparative study shows that good results are obtained when the amount of lead depositted in the superconductive ceramic pellet is between 5% and 40%, that is, examples No. 3, 4 and 5.

TABLE 1

| No. | proportion of lead deposition by ceramic material (volume %) | Critical temperature Tc (°K.) | Critical Electric Current Density Jc ($A/cm^2$) at 77° K. |
|---|---|---|---|
| 1 | 0 | — | no superconductivity |
| 2 | 3 | 93 | 1,600 |
| 3 | 5 | 91 | 4,700 |
| 4 | 15 | 90 | 4,600 |
| 5 | 40 | 92 | 2,600 |
| 6 | 50 | 90 | 700 |

What is claimed is:

1. A method for making a superconductive ceramic wire, the method comprising the steps of:

(a) preparing a superconductive porous ceramic body;
(b) depositing an affinity coating in pores of said ceramic body; then
(c) depositing lead in pores of said ceramic body in the amount of between 5% and 40% by volume of the superconductive porous ceramic body by soaking said ceramics in molten lead, thereby producing a ceramic product;
(d) covering the ceramic product of step (c) with a metal, thereby forming a metal-clad ceramic product; and
(e) extending said metal-clad ceramic product into a wire.

2. The method for making a superconductive ceramic wire according to claim 1 wherein said affinity coating is copper.

3. The method for making a superconductive ceramic wire according to claim 2 including forming the copper affinity coating by chemical plating.

4. The method for making a superconductive ceramic wire according to claim 1 wherein said affinity coating is tin.

5. The method for making a superconductive ceramic wire according to claim 4 including forming the tin affinity coating by chemical plating.

6. The method for making a superconductive ceramic wire according to claim 1 wherein the porous ceramic body is essentially composed of at least one yttrium-including rare earth element, at least one alkaline earth metal, copper and oxygen.

7. The method for making a superconductive ceramic wire according to claim 6 including preparing the superconductive porous ceramic body by;
(a) mixing powdery yttrium oxide ($Y_2O_3$), powdery barium carbonate ($BaCO_3$), powdery copper monoxide (CuO) at a molecular proportion of 0.5:2:3, thereby providing a powdery mixture;
(b) making a compound having a composition of $YBa_2Cu_3O_7$ and a perovskite structure by heat-treating the powdery mixture;
(c) pulverizing the compound;
(d) mixing the pulverized compound with a binding material, thereby providing a mixture of powdery $YBa_2Cu_3O_7$ and the binding material; and
(e) heat-treating the mixture of powdery $YBa_2Cu_3O_7$ and the binding material.

8. The method for making a superconductive ceramic wire according to claim 1 wherein said metal used to cover the ceramic body is copper.

9. The method for making a superconductive ceramic wire according to claim 1 wherein said metal used to cover the ceramic body is silver.

* * * * *

UNITED STATES PATENT AND TRADEMARK OFFICE
CERTIFICATE OF CORRECTION

PATENT NO. : 5,252,549

DATED : October 12, 1993

INVENTOR(S) : Yamaguchi et al

It is certified that error appears in the above-indentified patent and that said Letters Patent is hereby corrected as shown below:

On the title page, item [73] Assignee: Change "Mitsubishi Kinzoku Kabushiki Kaisha, Tokyo, Japan" to read --Mitsubishi Materials Corporation, Tokyo, Japan--.

Signed and Sealed this

Tenth Day of May, 1994

Attest:

BRUCE LEHMAN

Attesting Officer     Commissioner of Patents and Trademarks